United States Patent [19]

Douglas

[11] Patent Number: 5,240,104
[45] Date of Patent: Aug. 31, 1993

[54] PRINTED CIRCUIT BOARD BELT CONVEYOR

[76] Inventor: John J. Douglas, Rte. 1, Box 379, Lynch Station, Va. 24571

[21] Appl. No.: 830,378

[22] Filed: Jan. 31, 1992

[51] Int. Cl.$^5$ .............................................. B65G 15/10
[52] U.S. Cl. ..................... 198/817; 198/570
[58] Field of Search ...................... 198/817, 465.3, 570

[56] References Cited

U.S. PATENT DOCUMENTS

| | | |
|---|---|---|
| 1,123,999 | 1/1915 | Dupuy . |
| 1,476,936 | 12/1923 | Walden . |
| 1,645,005 | 10/1927 | Hothersall . |
| 1,781,750 | 11/1930 | Dodge et al. . |
| 2,662,633 | 12/1953 | Kingsley . |
| 3,002,618 | 10/1961 | Derderian et al. . |
| 3,283,882 | 11/1966 | Conrad . |
| 3,604,554 | 9/1971 | Martz . |
| 3,923,148 | 12/1975 | Dorner ............................. 198/570 |
| 3,948,385 | 4/1976 | Shinomiya . |
| 3,965,523 | 6/1976 | Elliott ............................ 198/817 X |
| 4,217,977 | 8/1980 | Tam ................................. 198/341 |
| 4,287,983 | 9/1981 | Bronsveld ......................... 198/817 |
| 4,390,091 | 6/1983 | Gonzalez .......................... 198/358 |
| 4,457,419 | 7/1984 | Ogami ............................. 198/345 |
| 4,484,675 | 11/1984 | Doherty et al. ..................... 198/413 |
| 4,511,028 | 4/1985 | Meister ........................... 198/570 X |
| 4,512,455 | 4/1985 | Thorn et al. ...................... 198/404 |
| 4,561,819 | 12/1985 | Wiernicki ......................... 198/345 X |
| 4,591,044 | 5/1986 | Ogami et al. ...................... 198/346.3 |
| 4,643,129 | 2/1987 | Sari .............................. 198/817 X |
| 4,727,980 | 3/1988 | Ochi et al. ....................... 198/812 |
| 4,754,867 | 7/1988 | De Anda .......................... 198/464.2 |
| 4,793,463 | 12/1988 | Kane ............................. 198/403 |
| 4,823,940 | 4/1989 | Cretser ........................... 198/817 |
| 4,844,231 | 7/1989 | Usui .............................. 198/345 |
| 4,874,081 | 10/1989 | Kondo ............................. 198/803.9 |
| 4,890,717 | 1/1990 | Kane ............................. 198/403 |
| 4,936,437 | 6/1990 | Gearhart .......................... 198/403 |
| 4,967,898 | 11/1990 | Mueller et al. .................... 198/404 |
| 4,969,552 | 11/1990 | Kennicutt et al. .................. 198/399 |
| 4,991,984 | 2/1991 | Fare .............................. 474/117 X |

FOREIGN PATENT DOCUMENTS

| | | |
|---|---|---|
| 0256926 | 2/1988 | European Pat. Off. . |
| 2205153 | 8/1973 | Fed. Rep. of Germany . |
| 62-211208 | 9/1987 | Japan . |
| 86/00457 | 11/1986 | PCT Int'l Appl. . |
| 87/00580 | 3/1987 | PCT Int'l Appl. . |
| 2067494 | 7/1981 | United Kingdom . |

Primary Examiner—Robert P. Olszewski
Assistant Examiner—Cheryl L. Gastineau

[57] ABSTRACT

The invention provides an article flipper comprising a first turnover member mounted to a conveyor frame member for rotation about an axis substantially perpendicular to said frame member, a slot in the turnover member for receiving a side edge of sheets, a stop for arresting sheets with a leading portion of the side edges in the slot, and a rotator for rotating the first turnover member through about 180 degrees. The article flipper may include a second turnover member having a detent or being movable to clamp sheets between it and the first turnover member, or may include a rack and pinion. A belt tensioner which may be used with the article flipper is also provided and comprises a tensioning wheel for engaging the belt, a moveable block including a shaft for mounting the tensioning wheel, and a wedge for urging the block toward the belt. A belt change facilitator which may be used with the article flipper is also provided and comprises a sprocket for circulating the belt, a splined shaft, and a releasable lock for connecting the shaft to the sprocket. In another aspect, the invention relates to a method for flipping articles.

9 Claims, 8 Drawing Sheets

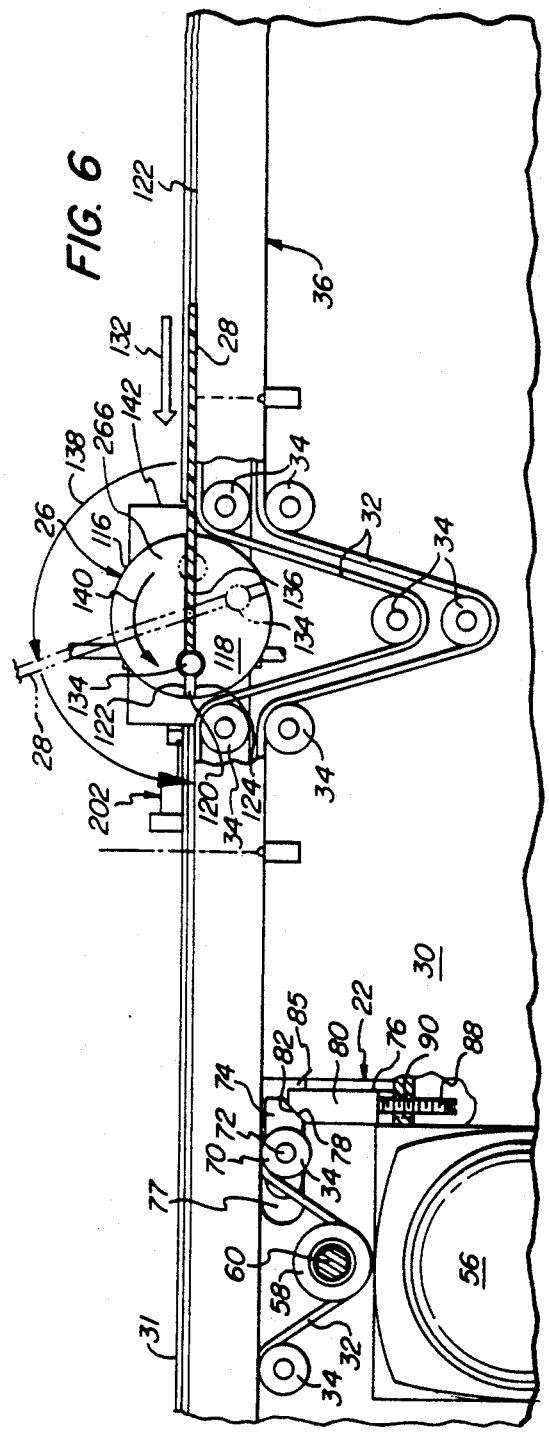
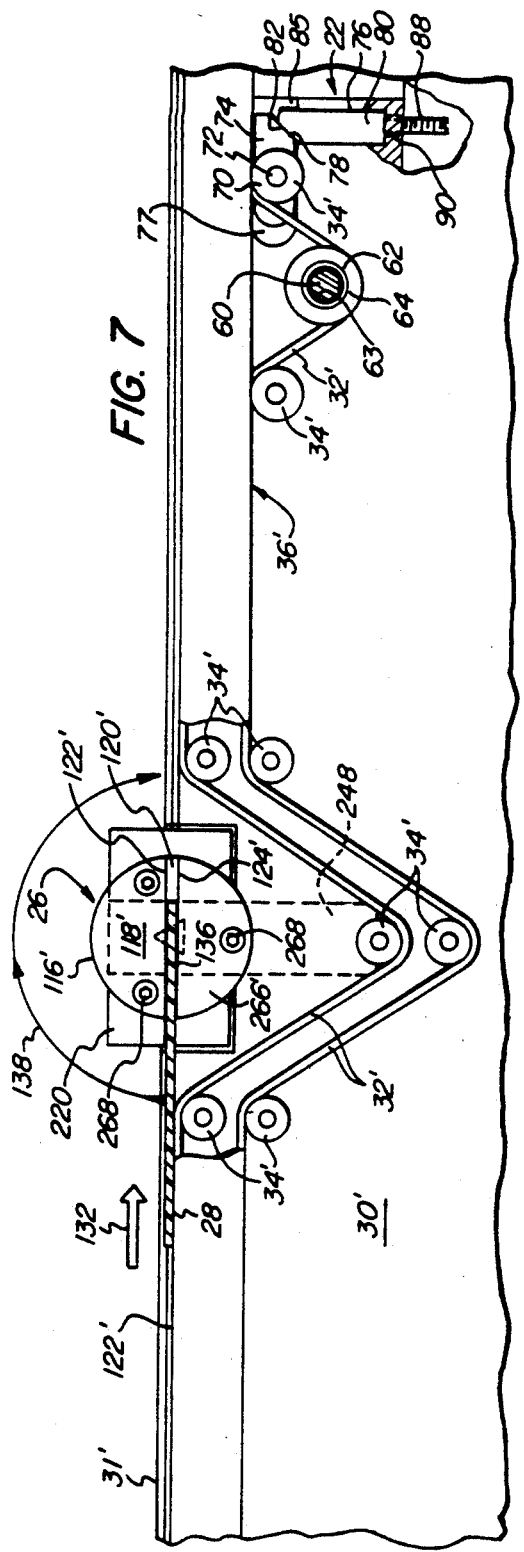

PRINTED CIRCUIT BOARD BELT CONVEYOR

FIELD OF THE INVENTION

This invention relates to a conveyor for sheet material such as printed circuit (PC) boards. More specifically, this invention relates to an article flipper and subassemblies of a belt tensioner and a belt change facilitator.

BACKGROUND ART

Numerous conveyor systems having a variety of features are generally known for conveying PC boards (U.S. Pat. Nos. 4,969,552 and 4,874,081, and PCT/DE 86/00457), silicone wafers U.S. Pat. Nos. 4,217,977, 4,591,044 and 4,457,419), optical discs (U.S. Pat. No. 4,512,455), and other sheet materials (U.S. Pat. Nos. 3,948,385, 4,727,980, 4,484,675 and 4,967,898).

The turnover devices, belt tensioners and belt changing mechanisms of these and other prior art conveyor systems often require relatively complex apparatuses to perform fairly simple functions. Such designs are disadvantageous since they may unnecessarily complicate manufacture, operation and repair, as well as increase the cost, of conveyor systems. Turnover devices, belt tensioners and belt changing mechanisms having less complex designs are also known, but require relatively frequent replacement of parts and may suffer other functional deficiencies.

Known relatively complex turnover devices include those disclosed in U.S. Pat. Nos. 3,948,385, 4,512,455 and 4,969,552. The turnover device of U.S. Pat. No. 3,948,385 comprises upper and lower arms $4a,4b$ and swingable clamp arm 5 of a rotatable arm member assembly 4. The device of U.S. Pat. No. 4,512,455 includes a pair of coaxially mounted cam plates 52 and arm support wheels 40. Pickup arms 42 are spring biased toward conveyor 16 by caming projections 54 as support wheel 40 rotates in order to receive a disc. Pickup heads 58 are slidably mounted on arms 42 with bias from springs 70. The turnover device of U.S. Pat. No. 4,969,552 comprises a pair of channels 70 having milled slots, follower wheels 76,78 for guide 64, channel blocker 80, and a central pivot 88 connected to a slide 16. The device includes a vertical bar 12 upon which slides 16 rise permitting inversion of channels 70.

Less complex turnover devices, such as that disclosed in U.S. Pat. No. 4,484,675, simply lift an article through more than 90 degrees with curved turner arms 10 and permit it to pivot and fall back onto the conveyor. Devices such as this and other relatively simple designs disadvantageously do not enable articles to be relatively precisely located upon turning them over, and also may damage relatively fragile or sensitive articles.

Known relatively complex belt tensioner designs include those disclosed in U.S. Pat. Nos. 4,727,980 and 4,217,977. The belt tensioner of U.S. Pat. No. 4,727,980 requires lower beams 38,39, and internal pulley supports 43,44 each having first and second adjusting screws 41,42 and 45,46. The belt tensioner of U.S. Pat. No. 4,217,977 requires double conveyor pulleys 33,39, first and second sets of upper and lower idler pulleys 57,59 and 61,63, and a horizontal idler pulley 67. At least one of the pulleys in the first and second sets must be mounted on an axis skewed from the others.

Simpler belt tensioning mechanisms include "floating" drives, counterweight systems, and other variable tensioners. U.S. Pat. Nos. 1,476,936 and 4,991,984 disclose tensioners utilizing springs for tensioning belts. Spring tensioners may apply imprecise and variable tension to belts which may be disadvantageous for carefully engineered conveyor systems requiring precision belt speed. Such conveyors are useful to repeatedly deliver articles at a particular location along the conveyor. Also, springs may require periodic replacement.

U.S. Pat. No. 4,287,983 discloses a belt changing mechanism wherein endless chains are each carried in unitary cassettes. The chains are independently and individually removable and replaceable as a unit with the cassettes. Other means of changing belts may, for example, involve some degree of time-consuming disassembly or realignment of parts of the conveyor.

SUMMARY OF THE INVENTION

Accordingly, it is an object of this invention to provide an article flipper which is relatively simple in construction and is dependable in use.

Another object of this invention is to provide an article flipper of the above character which is used in a conveyor for sheet material.

A further object of the invention is to provide an article flipper of the above character which has a rack and pinion means for flipping the articles.

Yet another object of the invention is to provide an article flipper of the above character which has a detent for holding the article flipper in place after flipping.

A still further object of the invention is to provide a conveyor belt tensioner assembly which may be used in an article flipper of the above character.

Still another object of the invention is to provide a belt change facilitator which may be used in an article flipper of the above character.

A yet still further object of the above invention is to provide an article flipper of the above character having improved conveyor belt tensioning means.

Yet still another object of the invention is to provide an article flipper of the above character having an improved belt changing assembly.

Other objects of the invention will be obvious and may in part appear hereinafter.

These and other objects are achieved by provision of an article flipper having a rack and pinion, or a detent for flipping sheets such as PC boards.

The article flipper comprises a first turnover member, a slot in the turnover member for receiving a side edge of sheets, a stop for arresting sheets with a leading portion of the side edge in the slot, and a rotator for rotating the first turnover member through about 180 degrees. The article flipper may include a second turnover member having a detent or being movable to clamp sheets between it and the first turnover member, or having a pinion and at least one rack.

A belt tensioner which may be used with the article flipper is also provided and comprises a tensioning wheel for engaging the belt, a moveable block including a shaft for mounting the tensioning wheel, and a wedge for urging the block toward the belt. A belt change facilitator which may be used with the article flipper is also provided and comprises a sprocket for circulating the belt, a splined shaft, and a releasable lock for connecting the shaft to the sprocket. A conveyor comprising the article flipper in combination with the belt change facilitator or the belt tensioner is also provided.

In another aspect, the invention relates to a method for flipping articles comprising the steps of receiving an edge of a sheet in a slot on the pair of rotatable members, rotating one of the rotatable members to turn the sheet over, and releasably locking a detent on the other rotatable member.

The invention and its particular features will become more apparent from the following detailed description considered with reference to the accompanying drawings.

BRIEF DESCRIPTION OF THE DRAWINGS

FIG. 6 is a front elevation view of the rearward frame member, of the conveyor of FIG. 1 depicting the rotatably actuated turnover member.

FIG. 7 is a rear elevation view of the front frame member of the conveyor of FIG. 1 depicting the turnover member including a detent.

DETAILED DESCRIPTION

Figure 1:
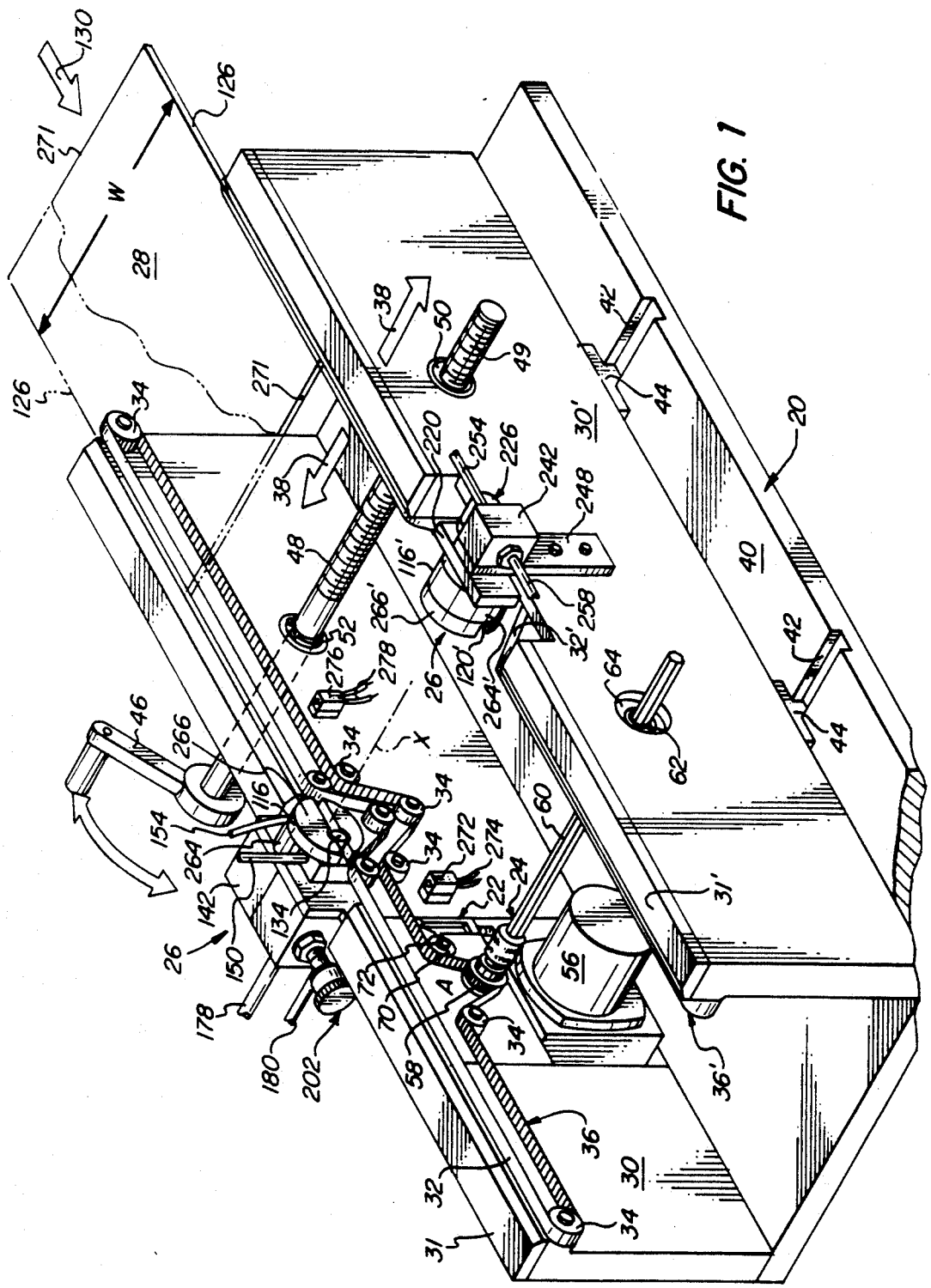
FIG. 1 is an isometric view of a conveyor in accordance with the invention.

A conveyor 20 in accordance with this invention including a belt tensioner 22, belt change facilitator 24, and an article flipper 26 is generally depicted in an isometric view in FIG. 1. Conveyor 20 is designed to convey and, if desired, turn articles 28 over. Articles 28 are preferably sheets of material such as PC boards. Most preferably, the sheet material is substantially rigid. Conveyor 20 is designed to convey PC boards between workstations where various tasks, for example mounting electronic components, are performed. Belt tensioner 22, belt changing mechanism 24 and article flipper 26 are designed to enable conveyor 20 to relatively rapidly, precisely, and carefully convey, and locate PC boards at the various workstations. In this regard, it is understood that belt tensioner 22 or belt changing facilitator 24 may be used with article flipper 26.

Conveyor 20 comprises a pair of frame members 30, 30' aligned substantially in parallel, and a pair of conveyor belts 32, 32' located around a plurality of turning wheels 34, 34' (turning wheels 34' not shown in this Figure) for circulation along conveyor belt paths 36, 36'. Bevelled guides 31, 31' atop respective frame members 30, 30', and in locating sheets 28 upon belts 32, 32'. Turning wheels 34, 34' are respectively mounted on frame members 30, 30'.

Frame members 30, 30' are preferably transversely adjustable in the direction of arrows 38 to accommodate articles 28 having various widths W. Most preferably, frame member 30 is rigidly mounted to base 40 and frame member 30' is movably mounted to base 40. In this regard, base 40 includes guide grooves 42 and frame member 30' includes low friction sliders 44 which fit within guide grooves 42. Frame member 30' is adjustable toward and away from frame member 30 by a crank 46 attached to a partially threaded rod 48. A threaded portion 49 of rod 48 is coupled to frame member 30' by a thread engaging element 50 while a non-threaded portion of rod 48 is fixed to a bearing 52 within frame member 30. Thus, rotation of crank 46 causes frame member 30' to slide along guide grooves 42.

Figure 2:
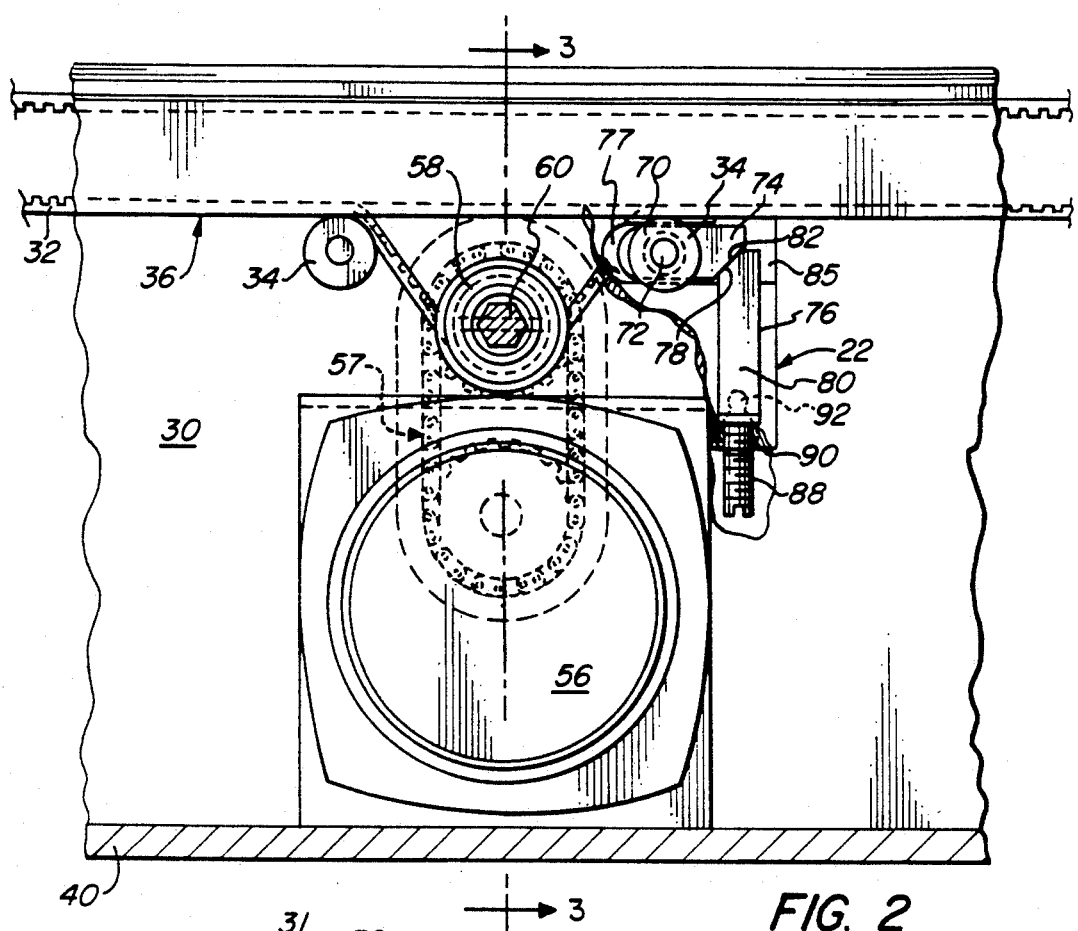
FIG. 2 is a partial front elevation view of the rearward frame member of the conveyor of FIG. 1 depicting the drive mechanism, and partially cut away to depict the belt tensioner.
Figure 3:
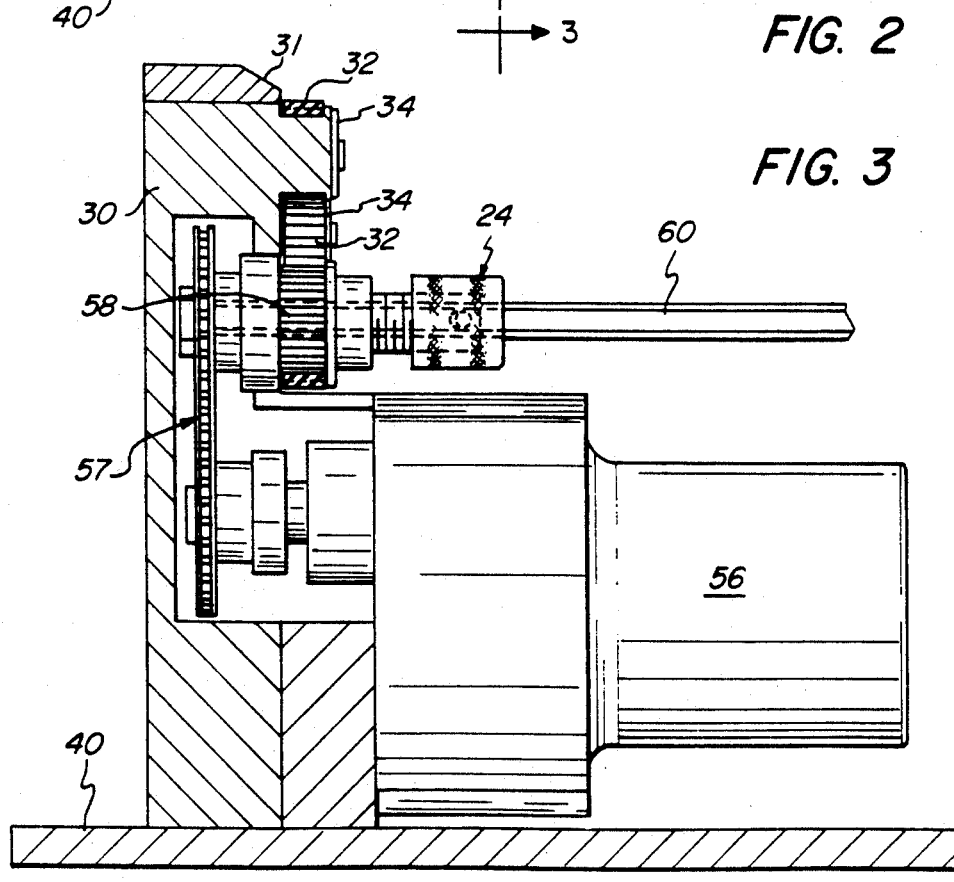
FIG. 3 is a side cross-section view of the forward frame member of the conveyor of FIG. 1 taken along the plane 3—3 from FIG. 2 depicting the drive mechanism and belt change facilitator.

Referring now to FIGS. 1 through 3, conveyor belts 32, 32' are circulated along respective belt paths 36, 36' by a motor 56. Although two motors are possible, a single motor is preferred to synchronize belt advancement. Motor 56 is coupled at 57 to rotate a turning wheel 34 which preferably comprises a sprocket 58. In this regard, conveyor belt 32 is preferably notched to match sprocket 58, whereby motor 56 provides more positive drive and less slip to conveyor belt 32. Although not strictly necessary, other of turning wheels 34 may also be provided as sprockets including teeth matching the notches in conveyor belt 32. Sprocket 58, then, drives conveyor belt 32.

Figure 4:
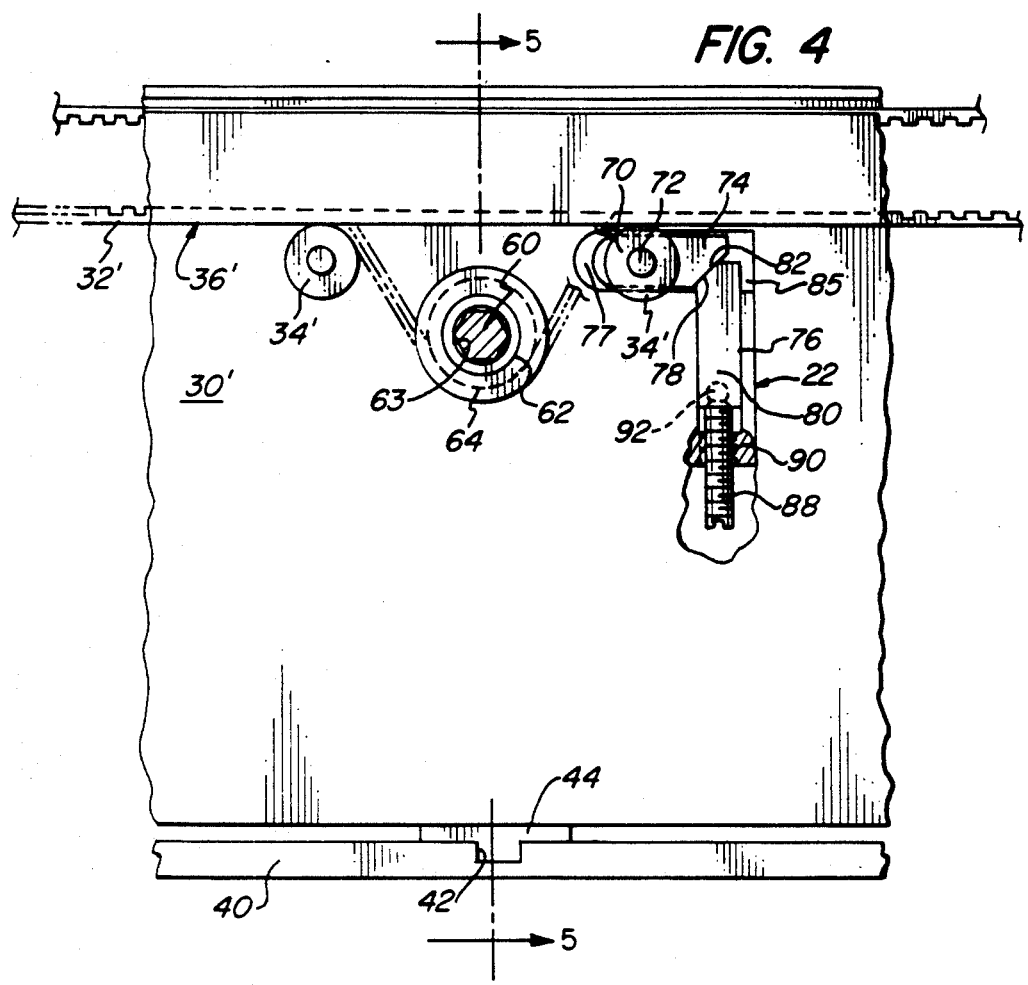
FIG. 4 is a partially cut away, partial rear elevation view of the forward frame member of the conveyor of FIG. 1 depicting the belt tensioner.
Figure 5:
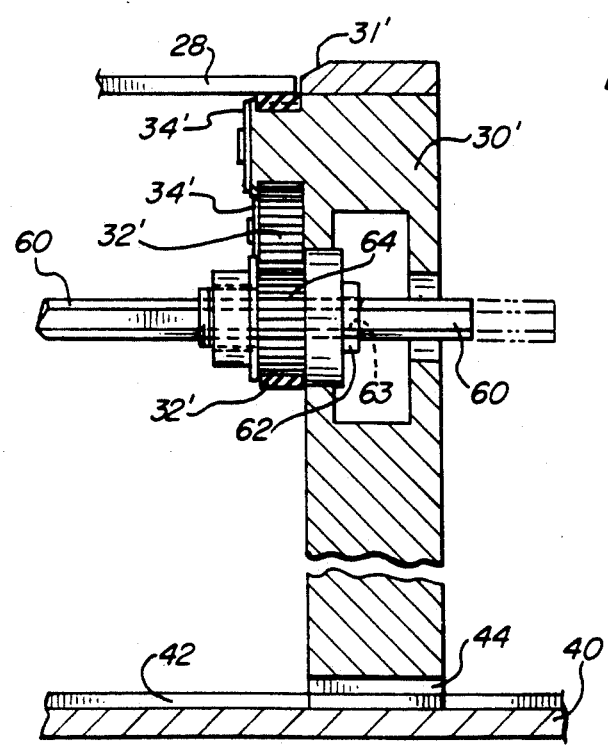
FIG. 5 is a side cross-section view of the rearward frame member of the conveyor of FIG. 1 taken along the plane 5—5 from FIG. 4.
Figure 8:
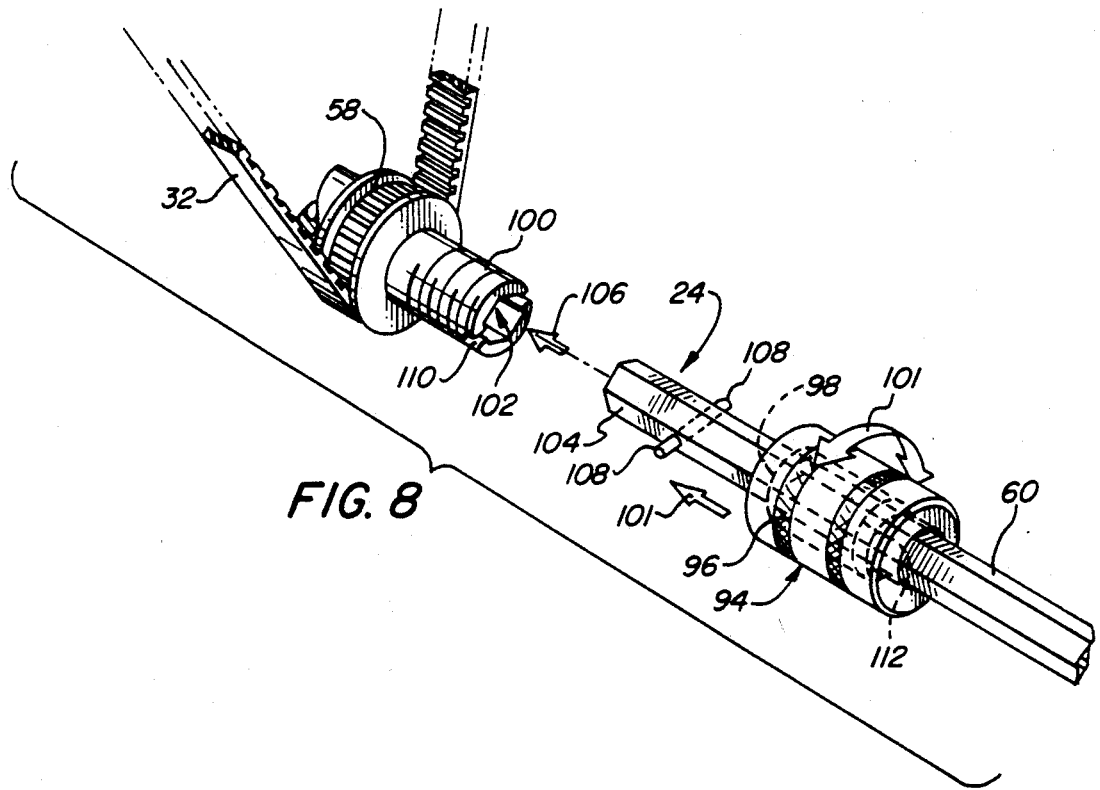
FIG. 8 is an enlarged isometric view of the belt change facilitator of the conveyor of FIG. 1.

Referring now to FIGS. 1, 4 and 5, sprocket 58 also rotates, via motor 56, splined shaft 60 which is axially connected (see FIGS. 2, 3 and 8) to sprocket 58. Splined shaft 60 is slidingly received through a hub 62 of a turning wheel 34' which preferably comprises a sprocket 64. Hub 62 includes grooves 63 which match splined shaft 60 so that rotation of splined shaft 60 rotates sprocket 64. Sprocket 64, then, drives conveyor belt 32'. Conveyor belt 32' is similarly notched to match sprocket 64, whereby motor 56 provides more positive drive and less slip to conveyor belt 32'. Again although not strictly necessary, other of turning wheels may be provided as sprockets matching notched conveyor belt 32'.

Because splined shaft 60 is slidingly received through hub 62, as indicated by the dashed line portion of the shaft in FIG. 5, frame member 30' may be adjusted toward and away from frame member 30 without necessitating disassembly of the drive mechanism for conveyor belts 32, 32'. Further, because hub 62 of sprocket 64 includes grooves 63 which match splined shaft 60, sprocket 64 is rotated by splined shaft 60 at any position therealong.

Referring now to FIGS. 2, 4, 6 and 7, belt tensioner 22 is shown in additional detail. The same belt tensioner is used on frame members 30, 30' to tension conveyor belts 32, 32'. Belt tensioner 22 comprises a tensioning wheel 70 mounted for rotation upon a shaft 72 fixed to a movable block 74. A wedge 76 or the like urges movable block 74 toward conveyor belt 32, 33' such that tensioning wheel 70 engages the belt to slightly lengthen the respective conveyor belt path 36, 36', thereby tensioning the belt.

Preferably, tensioning wheel 70 is located relative to either sprocket 58 or sprocket 64 so as to hold respective conveyor belt 32, 32' against the sprocket as the tensioning wheel is advanced toward the belt. In this regard, advancing movable block 74 toward conveyor belt 32, 32' not only slightly lengthens the belt path, but also tends to wrap the belt more firmly, or at least for a slightly longer distance, around the sprocket.

Preferably also, shaft 72 is located without or outside of belt path 36, 36' such that the conveyor belt 32, 32' is tensioned (the belt path is lengthened) by moving the belt inwardly, rather than outwardly. By "inwardly" is meant that, after tensioning, the area A enclosed by the belt path is reduced. Typically, in the prior art, a belt is tensioned by lengthening the belt path outwardly. These prior art designs may require the conveying surface to be extended in order to tension the belt, which can be disadvantageous in systems formed by conveyor units arranged one next to the other. In such systems, the belt may only be tensioned so far until adjacent conveyor units interfere with each other. This disadvantage is avoided by the invention which tensions belts inwardly.

Movable block 74 advances, and preferably slides, along a slot 77. Slot 77 is formed in frame member 30, 30' and disposed or aligned at an angle to belt path 36, 36'. Preferably, movable block 74 includes an angled surface 78 which is engaged by wedge 76 to slide the block toward conveyor belt 32, 32'.

Wedge 74 preferably also comprises a movable block 80 including an angled surface 82. Angled surface 82 of movable block 80 engages movable block 74, and preferably the angled surface thereof, to slide movable block 74 such that tensioning wheel 70 engages conveyor belt 32, 32'.

Movable block 80 advances along, and preferably slides within, a slot 85. Slot 85 is formed in frame member 30, 30' and disposed or aligned at an angle, preferably of about ninety degrees, to slot 77 for movable block 74.

Block tensioner 22 also comprises a threaded rod 88 or like means for advancing wedge 76 toward movable block 74 to tension conveyor belt 32, 32'. In this regard, frame member 30, 30' includes a thread engaging element 90 near an end of slot 85 to receive threaded rod 88. Preferably, wedge 76 includes an advancing means abutting element 92 for receiving an end of threaded rod 88 in abutment to prevent undue wear to wedge 76.

Referring now to FIGS. 1, 3 and especially 8, additional detail about belt change facilitator 24 is provided. Belt change facilitator 24 comprises a cap nut 94 or like means for releasably locking splined shaft 60 to sprocket 58. Preferably, cap nut 94 is manually releasable, and in this regard, may have a knurled outer surface 96 to facilitate manual release. Cap nut 94 includes a thread engaging inner surface 98 for engaging a threaded shaft portion 100 of sprocket 58 upon advancement and rotation of the cap nut along splined shaft 60 in the direction of arrows 101. Threaded shaft portion 100 extends axially from sprocket 58 and preferably has a hollow end 102 for receiving, indicated by arrow 106 as an end 104 of splined shaft 60 therein.

Splined shaft end portion 104 comprises a stop 108 which serves both to prevent further advancement of splined shaft 60 into hollow end 102, and to retain cap nut 94 upon splined shaft 60. Preferably stop 108 comprises a key which fits into a keyway 110 in threaded shaft portion 100 of sprocket 58. After insertion of splined shaft end portion 104 into hollow end 102 such that key stop 108 enters keyway 110, cap nut 94 may be rotated onto threaded shaft portion 100 until the inner rear wall 112 of the cap nut substantially abuts stop 108. Reversing the described order, splined shaft 60 may be relatively quickly disengaged from sprocket 58 in order to replace conveyor belt 32. Conveyor belt 32' may similarly be replaced by drawing disengaged splined shaft 60 through grooved hub 62 of sprocket 64 (see FIG. 5).

It is understood that sprockets 58 and 64 may be switched between frame members 30, 30' and also that motor 56 may be coupled as at 57 to drive either sprocket.

Referring now to FIGS. 1, 6 and 7, additional detail about article flipper 26 is provided. Article flipper 26 comprises a pair of turnover members 116, 116' mounted opposite each other to frame members 30, 30' on a common axis X substantially perpendicular to the frame members. Opposing sides 118, 118' of turnover members 116, 116' includes slots 120, 120' substantially aligned with an upper or conveying surface 122, 122' of conveyor belts 32, 32'. Slots 120, 120' have upper walls 122' 122' and lower walls 124, 124' for receiving edges 126 of sheets 28 therebetween. In this regard, turning wheels 34, 34' prevent conveyor belts 32, 32' from interfering with sides 118, 118' of turnover members 116, 116' which sides extend into the article conveying path.

A sheet 28 moving along conveyor 20 in the direction of arrow 130 (FIG. 1) will be received at its edges 126 in slots 120, 120' of turnover members 116, 116' along the direction of arrows 132 (FIGS. 6 and 7). Depending upon the desired function of turnover members 116, 116', sheet 28 may continue moving in the direction of arrows 130, 132 and pass completely through slots 120, 120'. Alternatively, sheet 28 may be stopped, by stop 134 which extends into slot 120, with a leading portion 136 of edges 126 of the sheet within slots 120, 120' as illustrated in FIGS. 6 and 7.

About the time sheet 28 is stopped with its edges 126 within slots 120, 120', sheet 28 may be turned or flipped over, as indicated by arrows 138, by rotating turnover member 116 through about 180 degrees in the direction of arrow 140. A rotator 142, mounted on frame member 30, is connected to rotate turnover member 116. Rotator 142 may comprise a spiral actuator (Zaytran), a stepper motor, or a servo motor, but is preferably a rack and pinion actuator.

Figure 9:
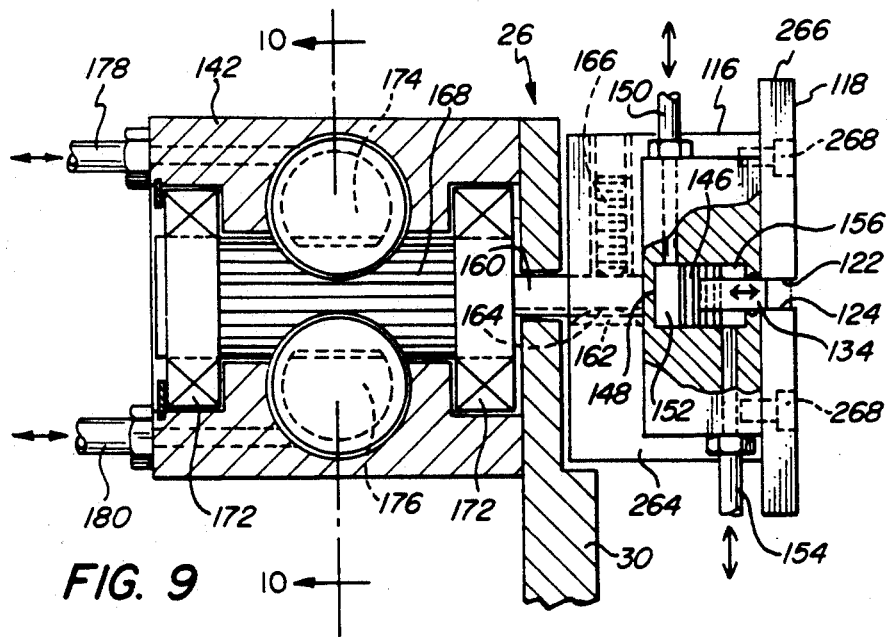
FIG. 9 is an enlarged side cross-section view of the rotatably actuated turnover member and the rotator of the conveyor of FIG. 1 depicting a pinion and two racks, and partially cut away to depict an article stop.

Referring now to FIG. 9, a side cross-sectional view of rotator 142 is partially cut away at turnover member 116 to reveal detail of stop 134. Stop 134 is mounted on a rod 146 which is sealingly, slidingly received within stop cylinder 148. Introduction of fluid along line 150 to chamber 152 extends stop 134 into slot 120 such that it arrests leading portion 136 of sheets 28 therein. Conversely, introduction of fluid along line 154 to chamber 156 withdraws stop 134 from slot 120 such that sheets 28 may pass therethrough.

Turnover member 116 is mounted for rotation with rotator shaft 160. To prevent slippage, turnover member 116 preferably includes a key 162 and shaft 160 preferably includes a keyway groove 164. Set screw 166 clamps turnover member 116 to rotator shaft 160. Rotator shaft 160 extends through frame member 30 to a pinion 168 mounted in bearings 172 within rotator 142. Pinion 168 is rotatable by upper rack 174 and lower rack 176.

Figure 10:
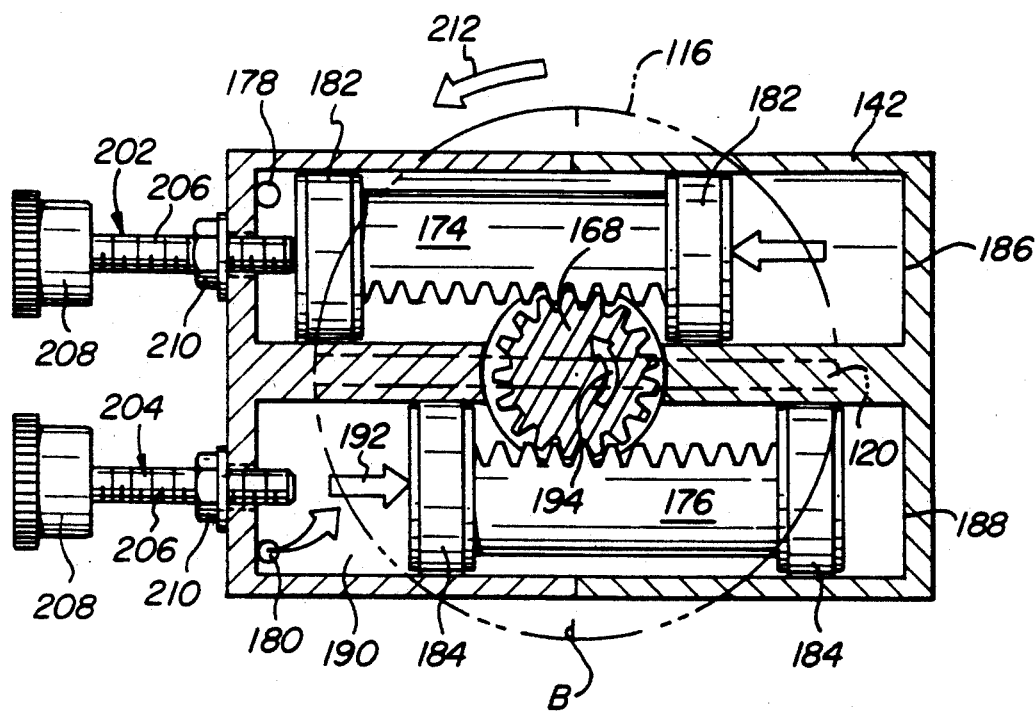
FIGS. 10 and 11 are enlarged end cross-section views of the pinion and racks of the conveyor of FIG. 1 depicting operation thereof.
Figure 11:
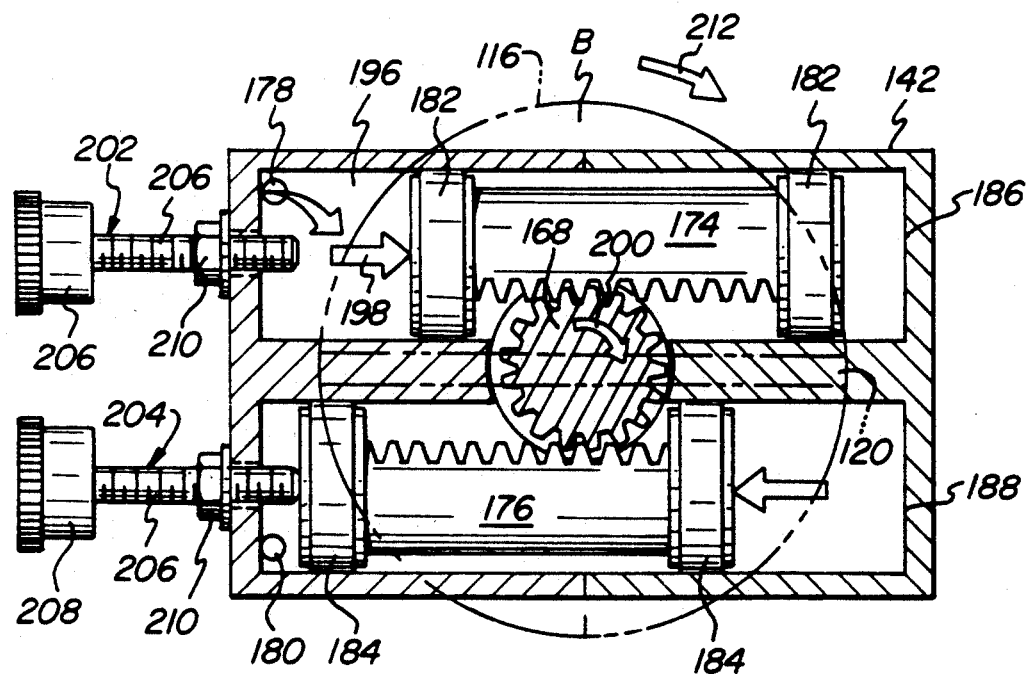

FIGS. 10 and 11 are cross-sectional views of rotator 142 taken along plane 10—10 in FIG. 9. Although not visible in these views, turnover member 116 is depicted for reference. Racks 174, 176 are each mounted between respective rod pairs 182, 184. Rod pairs 182, 184 are sealingly slidingly mounted in respective rack cylinders 186, 188. Introduction of fluid along line 180 into lower rack chamber 190, as illustrated in FIG. 10, advances lower rack 176 in the direction of arrow 192 rotating pinion 168 in the direction of arrow 194. Similarly, introduction of fluid along line 178 into upper rack chamber 196, as illustrated in FIG. 11, advances upper rack 174 in the direction of arrow 198 rotating pinion 168 in the direction of arrow 200.

Adjustable stop 202 limits the distance lower rack 176 travels under influence of fluid from line 180 (FIG. 10), and adjustable stop 204 limits the distance upper rack 174 travels under influence of fluid from line 178 (FIG. 11). Adjustable stops 202, 204 each comprise threaded rods 206 which are threaded into rotator 142, and are respectively adjusted to abut the adjacent rod of rod pairs 182, 184 within chambers 190, 196. Adjustment of the added rods 206 is made by knobs 208 connected to the rods, and is secured by nuts 210.

Adjustable stops 202, 204 are set to abut rods 182, 184, about 180 degrees apart when slot 120 on turnover member 116 is aligned substantially parallel to conveyor belt path 36, 36'. For example, in FIG. 10, slot 120 is depicted as substantially horizontal and an imaginary point B is depicted at the bottom of turnover member 116, while, in FIG. 11, slot 120 is also depicted as substantially horizontal but imaginary point B is now located at the top of turnover member 116. Thus, alternately introducing fluid along lines 178, 180 causes turnover member 116 to rotate back and forth through about 180 degrees in the direction of arrows 212.

Returning briefly to FIGS. 6 and 7, opposing edges 126 of sheets 28 are received within slots 120, 120' of turnover members 116, 116' between upper walls 122, 122' and lower walls 124, 124' of the slots. Thus, as turnover member 116 is rotated by rotator 142, not only sheet 28 but also turnover member 116' is rotated by virtue of receipt of edge 126 of sheet 28 within slot 120' of turnover member 116'. Sheet 28, then, serves as an axle permitting rotation of turnover member 116 to be followed by turnover member 116'.

Figure 12:
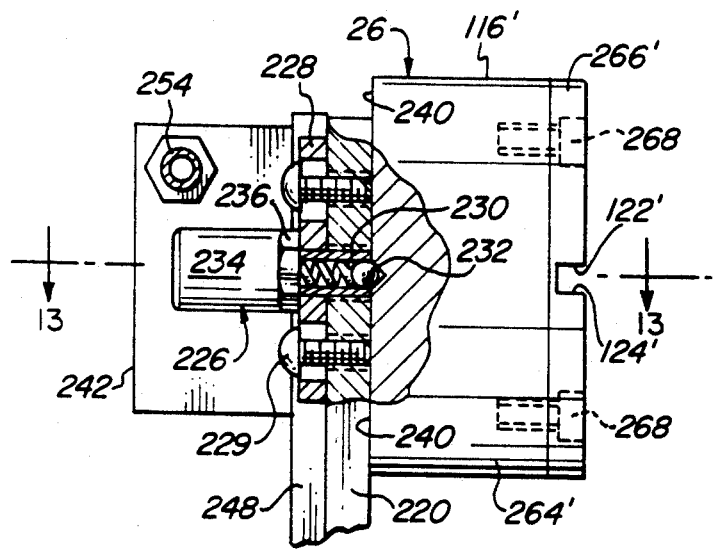
FIG. 12 is an enlarged partially cut away side view of the detent turnover member and the clamp of the conveyor of FIG. 1 depicting the detent.
Figure 13:
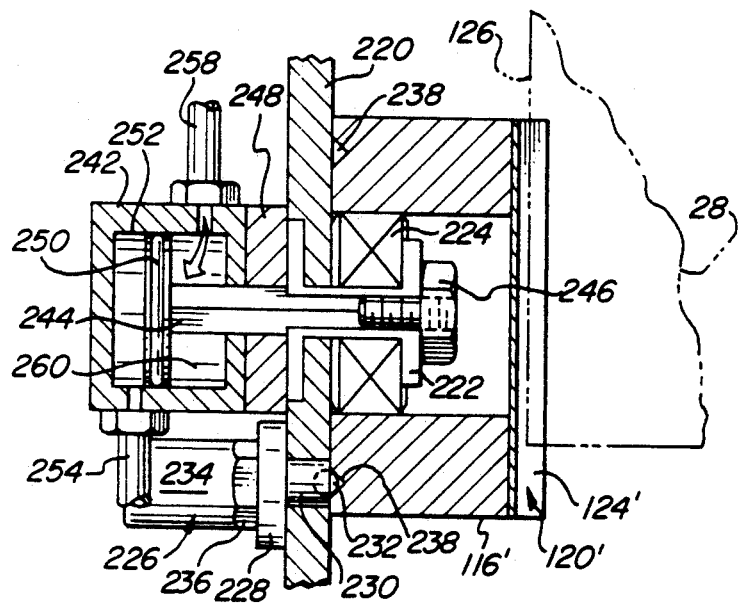
FIG. 13 and 14 are enlarged top cross-section views of the detent turnover member and the clamp of the conveyor of FIG. 1 depicting a clamping feature for holding articles between turnover members by opposite edges.
Figure 14:
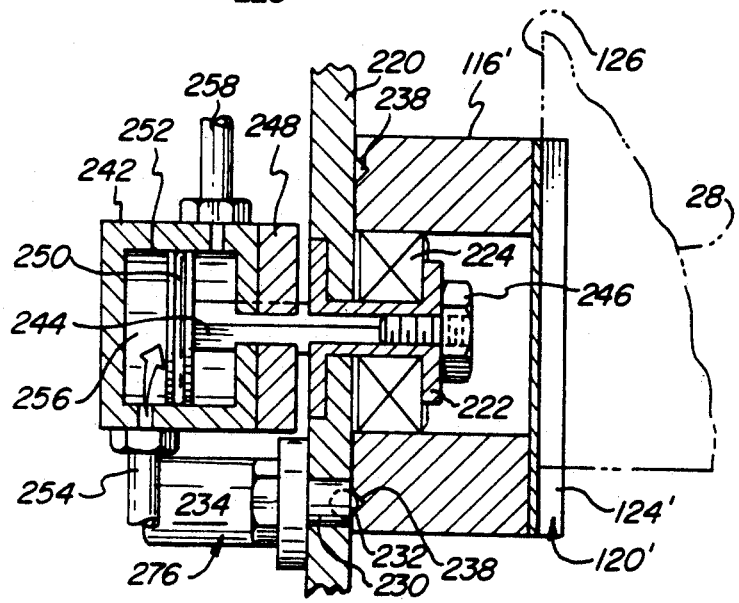

Referring now to FIGS. 12 through 14, cross-sectional views reveal additional detail of turnover member 116'. Turnover member 116' is mounted to a stationary back plate 220 by a collared sleeve 222 or the like. Collared sleeve 222 permits relatively free rotation of turnover member 116' relative to stationary back plate 220 on bearing 224. Back plate 220 includes a detent 226 which releasably locks turnover member 116' in place at intervals of about 180 degrees. The detent intervals of turnover member 116' match the 180 degree rotations of turnover member 116 so that slots 120, 120' are both held substantially parallel to belt paths 36, 36' to facilitate relatively unimpeded ingress and egress of sheets 28 to and through article flipper 26.

Detent 226 comprises a base 228, a threaded sleeve 230 containing a spring-biased ball 232, a bias adjusting knob 234 and a securing nut 236. Base 228 is mounted to stationary back plate 220 by bolts 229. Spring-biased ball is received in precisely located shallows 238 located on rear surface 240 of turnover member 116' to releasably lock the turnover member in place. Bias adjusting knob 234 controls the bias placed on ball 232 which alters the force required to release turnover member 116' from detent 226. Preferably, shallow 238 is sized to substantially match the shape of ball 232.

Referring now to FIGS. 13 and 14, frame members 30, 30' are generally spaced apart an amount slightly greater than a width W of sheets 28 to prevent the sheets from binding as they are transported between workstations. This can lead to problems in flipping sheets however, where, for example, frame members 30, 30' are too far apart, or a sheet is not quite rectangular, such that an edge 126 of sheet 28 is not received within slot 120, 120'. Further, as illustrated in FIG. 13, even where frame members 30, 30' are properly adjusted and sheet 28 is rectangular, edges 126 of the sheet will not fit firmly between turnover members 116, 116' within slots 120, 120'. Thus, to improve reliability of flipping, turnover member 116' may be provided with a clamp 242 which axially moves turnover member 116' toward turnover member 116 to clamp sheets 28 therebetween with opposite edges 126 firmly within slots 120, 120'.

Clamp 242 includes a nonrotating shaft 244 upon which turnover member 116' and stationary back plate 220 are mounted as a unit with nut 246. Clamp 242—and by shaft 244, back plate 220 and turnover member 116'—is mounted to frame member 30' by a bracket 248 (see FIGS. 1 and 7). Shaft 244 is nonrotating so that slot 120' of turnover member 116' is not displaced relative to conveyor belt path 36' by action of clamp 242. Nonrotating shaft 244 is connected to a rod 250 sealingly, slidingly disposed within clamp cylinder 252.

Introduction to fluid along line 254 into chamber 256 (FIG. 14) advances turnover member 116' and back plate 220 toward turnover member 116 to clamp sheet 28 therebetween for flipping. The distance which turnover member 116' advances for sufficient clamping may, for example, be controlled by monitoring the pressure within line 254 and chamber 256. Introduction of fluid along line 258 into chamber 260 (FIG. 13) moves turnover member 116' and backplate 220 away from turnover member 116 to release sheet 28 for egress out of slots 120, 120'.

Returning to FIGS. 1, 6 and 7, it is understood that turnover member 116', detent 226 and clamp 242 may be mounted on frame member 30, and that turnover member 16 and rotator 142 may be mounted on frame member 30'. Further, turnover member 116' is operable with or without clamp 242.

Turnover members 116, 116' comprise a drum 264, 264' and a slotted plate 266, 266'. Slotted plates 266, 266' are fastened to respective drums 264, 264' by bolts or the like 268 only shown in FIGS. 7, 9 and 12). In this regard, slotted plates may be removed or replaced to accommodate sheets of different size or thickness. Generally, a larger sheet requires a larger diameter slotted plate having a longer slot for more reliable flipping.

Figure 15:
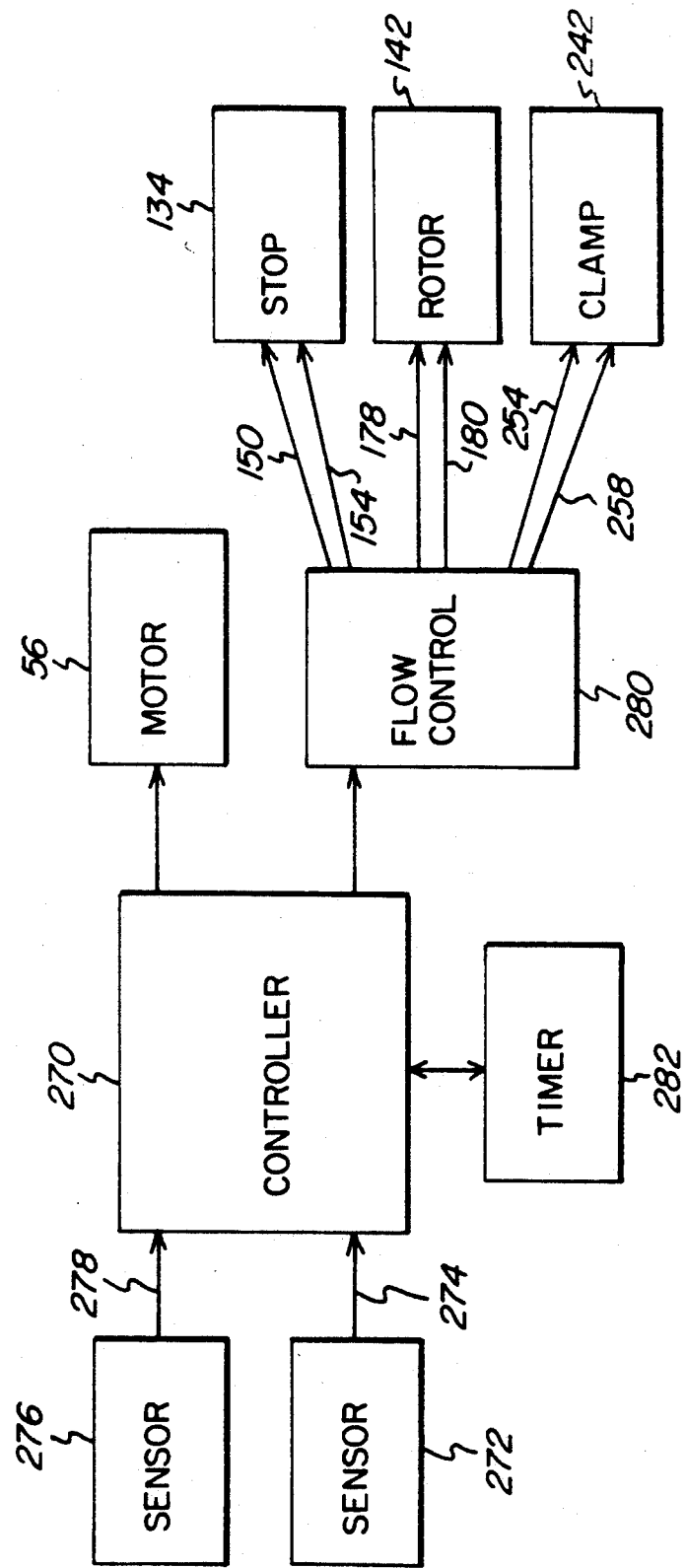
FIG. 15 is a schematic block diagram depicting control of the conveyor of FIG. 1.

Returning now to FIGS. 1 and 15, the operational features of conveyor 20 may be described. A controller 270 (only shown in FIG. 15) is programmed with instructions on whether sheets should be flipped or passed through article flipper 26. If sheet 28 is to be flipped, controller 270 instructs flow control 280 (only shown in FIG. 15) to pressurize line 150 and extend stop 134. Conversely, if sheet 28 is to be passed through, controller 270 instructs flow control 280 to pressurize line 154 and withdraw stop 134 from slot 120.

If sheet 28 is to be flipped, sensor 276 senses an edge 271 of sheet 28 as it is transported toward article flipper 26. Upon sensing edge 271, controller starts timer 282 (only shown in FIG. 15). The setting of timer 282 depends upon the distance between sensor 276 and stop 134, and the speed of conveyor belts 32, 32'. Timer 282 is set so that time runs out as the leading edge of sheet 28 reaches stop 134. At time out, controller 270 begins the article flipping sequence, preferably first by stopping motor 56 to prevent undue wear to sheet 28.

If clamp 242 is used, controller 270 causes line 254 to be pressurized, clamping sheet 28. Then, whether or not clamp 242 is used, controller 270 causes line 180 to be pressurized flipping sheet 28. Next, line 258 is pressurized to unclamp sheet 28, and motor 56 is restarted to transport flipped sheet 28 beyond article flipper 26. When sensor 272 senses an edge of sheet 28, controller 270 may, if necessary, be instructed to return turnover member 116 to its original position to receive the next sheet, by pressurizing line 128.

It is understood that sensors 272, 276 could each perform the other's function in the above sequence. In this regard, article flipper 26 can flip articles in both directions and motor 56 can drive belts 32, 32' in both directions. Also, if article 28 is not to be flipped, sensors 272, 276 can be used to sense when an article has successfully passed through article flipper 26.

Although the invention has been described with reference to a particular arrangement of parts, features and the like, these are not intended to exhaust all possible arrangement or features, and indeed many other modifications and variations will be ascertainable to those of skill in the art.

What is claimed is:

1. A belt change facilitator for a conveyor comprising first and second conveyor belts;
   first sprocket means for circulating said first conveyor belt;
   a motor coupled to rotate said first sprocket means;
   a splined shaft having a stop;
   means for manually releasably locking said splined shaft to said first sprocket means with said stop abutting said first sprocket means such that said first sprocket means rotates said splined shaft; and
   second sprocket means for circulating said second conveyor belt, said second sprocket means having a grooved hub matched to slidingly receive said splined shaft therethrough such that said splined shaft rotates said second sprocket means, whereby said conveyor belts may be relatively quickly and easily replaced by releasing said splined shaft from said first sprocket means.

2. The belt change facilitator of claim 1 wherein said first sprocket means comprises a shaft portion extending toward said second sprocket means, said shaft portion having a hollow end for receiving said splined shaft therein.

3. The belt change facilitator of claim 2 wherein said shaft portion is threaded and wherein said releasable locking means comprises a nut freely rotatable about said splined shaft, said nut having threads for engaging said threaded shaft portion to manually releasably lock said splined shaft to said shaft portion.

4. The belt change facilitator of claim 1 wherein said stop comprises a key stop and wherein said first sprocket means includes a keyway for receiving said key stop.

5. The belt change facilitator of claim 1 wherein said manually releasable locking means comprises a nut freely rotatable about said splined shaft and retained on said splined shaft by said stop, said nut for manually releasably locking said splined shaft to said first drive sprocket means.

6. The belt change facilitator of claim 1 wherein said splined shaft has a hexagonal cross section.

7. A belt change facilitator for a conveyor comprising first and second conveyor belts;
   first sprocket means for circulating said first conveyor belt;
   a splined shaft;
   means for releasably locking said splined shaft to said first sprocket means such that said first sprocket means rotates with said splined shaft; and
   second sprocket means for circulating said second conveyor belt, said second sprocket means having a grooved hub matched to slidingly receive said splined shaft therethrough such that said splined shaft rotates with said second sprocket means, whereby said conveyor belts may be relatively quickly and easily replaced by releasing said splined shaft from said first sprocket means, and by sliding it through said second sprocket means.

8. The belt change facilitator of claim 7 wherein said first sprocket means comprises a threaded portion and wherein said releasable locking means comprises a nut freely rotatable about said splined shaft, said nut having threads for engaging said threaded portion to releasably lock said splined shaft to said first sprocket means.

9. The belt change facilitator of claim 7 wherein said splined shaft includes a key and wherein said first sprocket means includes a keyway for receiving said key.

* * * * *